(12) United States Patent
Saito et al.

(10) Patent No.: US 11,140,796 B2
(45) Date of Patent: Oct. 5, 2021

(54) ELECTRONIC DEVICE STORAGE RACK AND RACK-MOUNTED TYPE ELECTRONIC DEVICE

(71) Applicant: NEC Corporation, Tokyo (JP)

(72) Inventors: Tadashi Saito, Tokyo (JP); Katsutoshi Mori, Tokyo (JP)

(73) Assignee: NEC CORPORATION, Tokyo (JP)

(*) Notice: Subject to any disclaimer, the term of this patent is extended or adjusted under 35 U.S.C. 154(b) by 21 days.

(21) Appl. No.: 16/824,871

(22) Filed: Mar. 20, 2020

(65) Prior Publication Data
US 2020/0315053 A1  Oct. 1, 2020

(30) Foreign Application Priority Data
Mar. 27, 2019  (JP) .............................. JP2019-061035

(51) Int. Cl.
*G06F 1/16* (2006.01)
*H05K 5/00* (2006.01)
(Continued)

(52) U.S. Cl.
CPC ......... *H05K 7/1489* (2013.01); *H05K 7/1418* (2013.01); *H05K 7/1461* (2013.01)

(58) Field of Classification Search
CPC .. H05K 7/1489; H05K 7/1418; H05K 7/1461; H05K 7/1491; H05K 7/1492; H05K 7/1494; H05K 7/1417; H05K 7/142
See application file for complete search history.

(56) References Cited

U.S. PATENT DOCUMENTS 7,436,674 B2 * 10/2008 Barsun .................. G06F 1/1601
  312/223.1
8,456,844 B2 *  6/2013 Chou .................... H05K 7/1494
  361/727
(Continued)

FOREIGN PATENT DOCUMENTS

JP   H09-162558 A    6/1997
JP   2002-368462 A  12/2002
(Continued)

OTHER PUBLICATIONS

Japanese Office Action for JP Application No. 2019-061035 dated Jun. 16, 2020 with English Translation.

*Primary Examiner* — Anthony M Haughton
(74) *Attorney, Agent, or Firm* — Sughrue Mion, PLLC

(57) ABSTRACT

An electronic device storage rack is equipped with a pair of first columns provided at intervals in a width direction; a pair of second columns provided at intervals in the width direction at positions away from the pair of first columns on a back side; a plurality of pairs of rails which connect the first column and the second column to support the electronic device main body to be slidable in a depth direction; a first fixing piece which is movable between an abutment position capable of abutting on the first column from the front side on the front side of the electronic device main body and a non-abutment position disposed between the first columns; and a second fixing piece which is movable between the abutment position capable of abutting on the second column from the back side on the back side of the electronic device main body and the non-abutment position disposed between the second columns.

6 Claims, 8 Drawing Sheets

(51) Int. Cl.
*H05K 7/00* (2006.01)
*H05K 7/14* (2006.01)

(56) References Cited

U.S. PATENT DOCUMENTS

| | | | | |
|---|---|---|---|---|
| 8,787,013 | B1* | 7/2014 | Czamara | G06F 1/20 |
| | | | | 361/679.47 |
| 9,019,706 | B2* | 4/2015 | Ning | H05K 7/1492 |
| | | | | 361/724 |
| 9,232,678 | B2* | 1/2016 | Bailey | H05K 7/1492 |
| 9,292,057 | B2* | 3/2016 | Cox | H05K 7/1489 |
| 9,603,289 | B1* | 3/2017 | Shearman | H05K 7/1488 |
| 9,723,747 | B1* | 8/2017 | Marrs | H05K 7/1489 |
| 10,856,429 | B2* | 12/2020 | Rosedahl | H05K 7/183 |
| 10,917,998 | B2* | 2/2021 | Shelnutt | H05K 7/20772 |
| 2005/0205505 | A1* | 9/2005 | Manabe | E05B 73/02 |
| | | | | 211/61 |
| 2005/0284033 | A1 | 12/2005 | Chen | |
| 2012/0090157 | A1 | 4/2012 | Iwasaki | |
| 2016/0167748 | A1* | 6/2016 | Dias | B63B 32/80 |
| | | | | 211/85.7 |
| 2017/0062255 | A1* | 3/2017 | Omori | A47B 96/028 |
| 2018/0098454 | A1 | 4/2018 | Chen et al. | |

FOREIGN PATENT DOCUMENTS

| | | |
|---|---|---|
| JP | 2005-133366 A | 5/2005 |
| JP | 4568423 B2 | 10/2010 |
| JP | 3185224 U | 8/2013 |
| JP | 2018-060518 A | 4/2018 |
| WO | 2011/001511 A1 | 1/2011 |

\* cited by examiner

ELECTRONIC DEVICE STORAGE RACK AND RACK-MOUNTED TYPE ELECTRONIC DEVICE

INCORPORATION BY REFERENCE

Priority is claimed on Japanese Patent Application No. 2019-61035, filed Mar. 27, 2019, the content of which is incorporated herein by reference.

BACKGROUND OF THE INVENTION

Field of the Invention

The present invention relates to an electronic device storage rack and a rack-mounted type electronic device.

Description of Related Art

A rack-mounted type electronic device in which an electronic device is accommodated in a dedicated device storage rack is known. This electronic device is, for example, an IT device such as a server. Japanese Patent No. 4568423 discloses an example of such a rack. In this rack, a base plate on which an electronic device is placed can be pushed in a depth direction, and can be pulled out.

Further, Japanese Utility Model Registration No. 3185224 describes a structure in which equipment which is an electronic device can be moved by sliding in a depth direction with respect to a rack. The equipment is provided with a movable mounting piece which fixes a position of the equipment with respect to a column of the rack. By separating the movable mounting piece from the rack, the equipment can be pushed to a side to the rear.

Incidentally, although electronic devices may be disposed overlapping each other in the vertical direction in the aforementioned rack, a plurality of electronic devices do not necessarily have the same dimensions in the depth direction. For this reason, when wiring is provided on a back face of the electronic devices, the position of the back face is different among the plurality of electronic devices in the aforementioned rack, and work of connecting the wiring on the back face may be difficult.

SUMMARY OF THE INVENTION

Therefore, an object of the present invention is to provide an electronic device storage rack and a rack-mounted type electronic device that solve the aforementioned problems.

An electronic device storage rack according to a first aspect of the present invention includes a pair of first columns which extend in a vertical direction and are provided with an interval therebetween in a width direction intersecting the vertical direction; a pair of second columns which are provided at a position away from the pair of first columns on a side to the rear in a depth direction intersecting the vertical direction and the width direction and with an interval therebetween in the width direction; a plurality of pairs of rails which are disposed in pairs with an interval therebetween in the width direction connecting the first column and the second column, provided at intervals in the vertical direction, and support an engaging part in an electronic device main body provided with wiring extending from the side to the rear for each pair and slidable in the depth direction; a first fixing piece which is provided on at least one end in the width direction on a side in front in the depth direction of the electronic device main body, and movable between an abutting position at which the first column is able to be abutted from the side in front and a non-abutting position of being disposed between the first columns; and a second fixing piece which is provided on at least one end in the width direction on the side to the rear of the electronic device main body, and is movable between an abutting position at which the second column is able to be abutted from the side to the rear and a non-abutting position of being disposed between the second columns.

A rack-mounted type electronic device according to a second aspect of the present invention includes the electronic device storage rack; and a plurality of electronic device main bodies accommodated in the electronic device storage rack to overlap in the vertical direction, wherein at least two types of electronic device main body having dimensions in the depth direction different from each other are included as the plurality of electronic device main bodies.

In the above aspect, it is possible to facilitate work of connecting the wiring on the back face of the electronic device main body.

DESCRIPTION OF PREFERRED EMBODIMENTS

Figure 1:
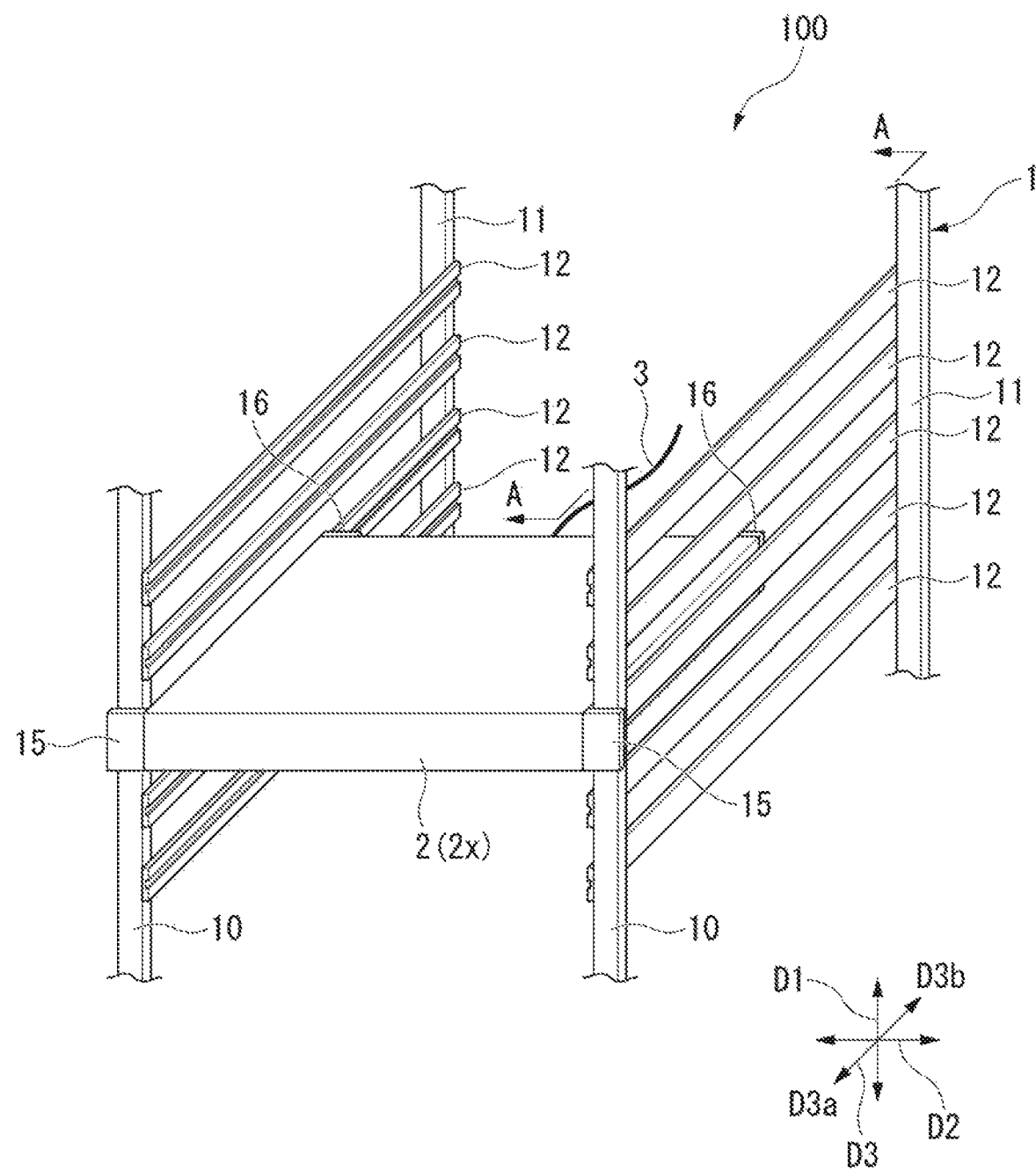
FIG. 1 is a perspective view of an embodiment of minimum components of a rack-mounted type electronic device according to the present invention as viewed from a side in front, showing a case in which an electronic device main body is disposed on the front side.

Hereinafter, respective embodiments will be described using the drawings. In all the drawings, components which are the same or corresponding are denoted by the same reference numerals, and repeated description thereof will be omitted.

<Embodiment of Minimum Components>

An embodiment of the minimum components of a rack-mounted type electronic device 100 will be described with reference to FIGS. 1 to 4.

Figure 2:
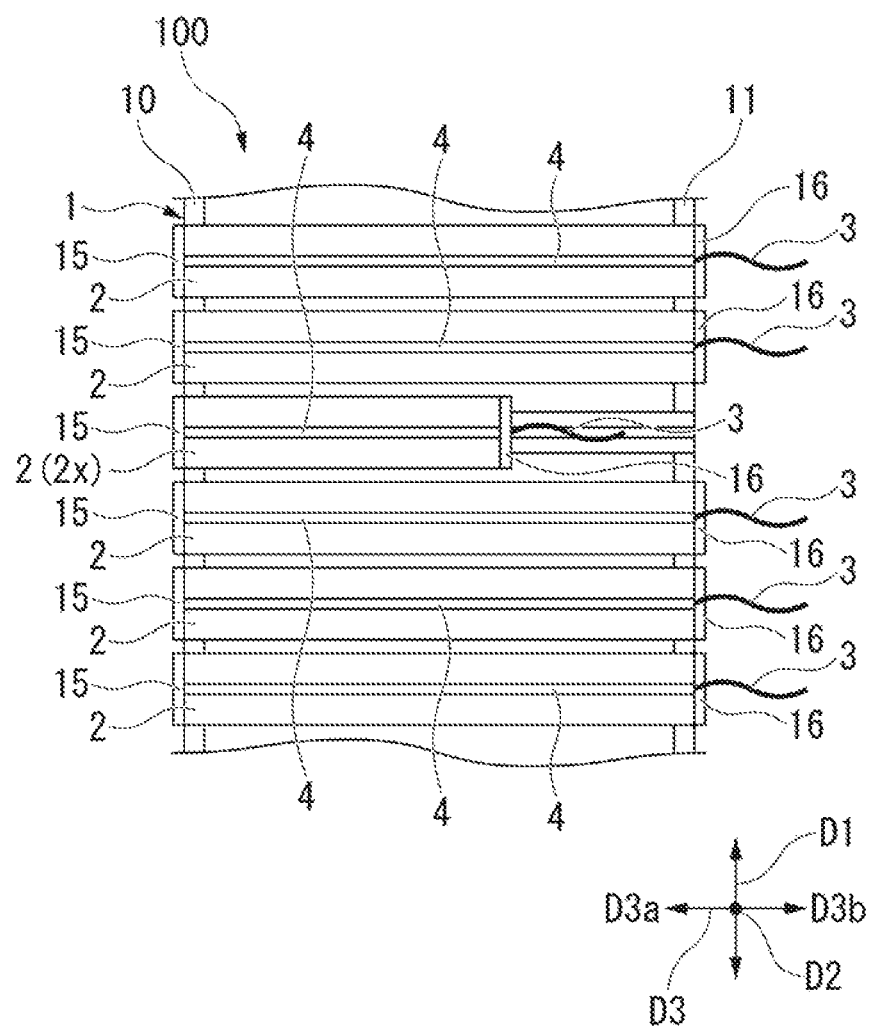
FIG. 2 is a longitudinal sectional view showing an embodiment of the minimum configuration of the rack-mounted type electronic device of the present invention and is a sectional view taken along a line A-A of FIG. 1.

As shown in FIGS. 1 and 2, a rack-mounted type electronic device 100 is equipped with an electronic device storage rack 1, and a plurality of electronic device main bodies 2 that are accommodated in the electronic device storage rack 1 to overlap in a vertical direction D1.

Figure 4:
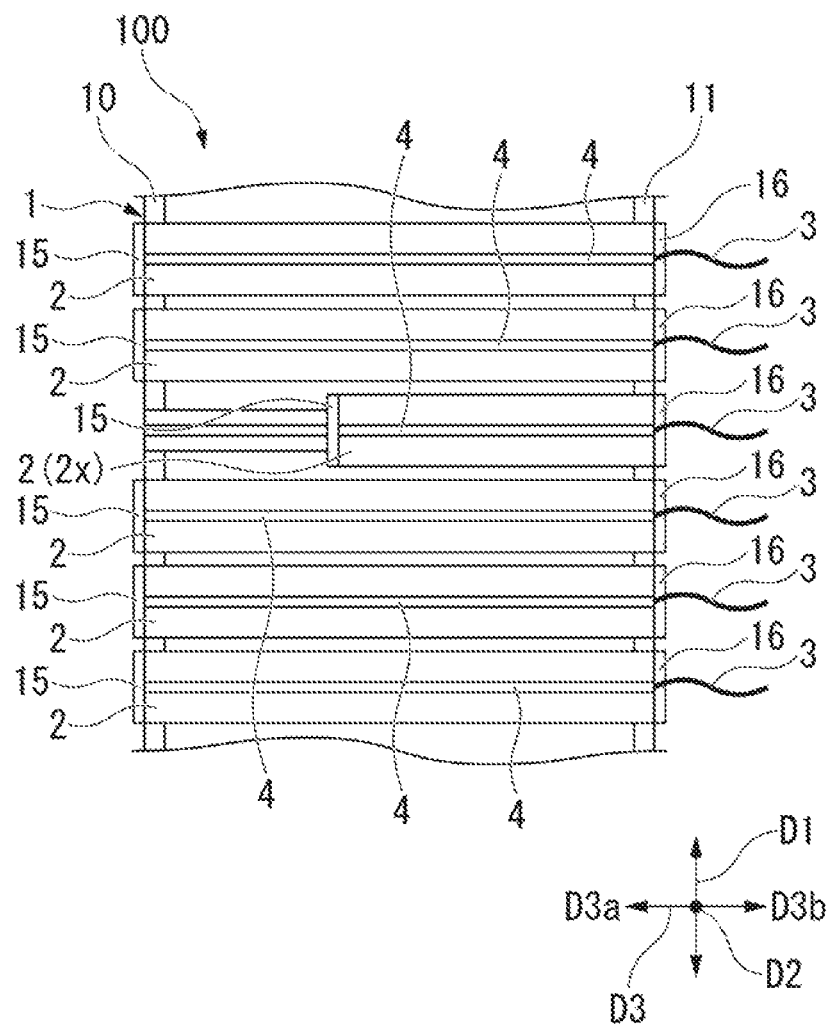
FIG. 4 is a longitudinal sectional view showing an embodiment of the minimum configuration of the rack-mounted type electronic device of the present invention and is a sectional view taken along a line B-B of FIG. 3.

As shown in FIGS. 2 and 4, wirings 3 are provided on a back face, which is an end portion on a side to the rear D3b in a depth direction D3 on the electronic device main body 2. The wirings 3 extend from the back face of the electronic device main body 2 toward the side to the rear D3b. As shown in FIGS. 2 and 4, one electronic device main body 2x among a plurality of electronic device main bodies 2 has a length in the depth direction D3 different from that of the other electronic device main bodies 2, and the length in the depth direction D3 of one electronic device main body 2x is smaller than that of other electronic device main bodies 2. That is, the plurality of electronic device main bodies 2 include at least two types of electronic device main body 2 having different length in the depth direction D3.

The electronic device storage rack 1 is equipped with first columns 10, second columns 11, a rail 12, a first fixing piece 15, and a second fixing piece 16.

Figure 3:
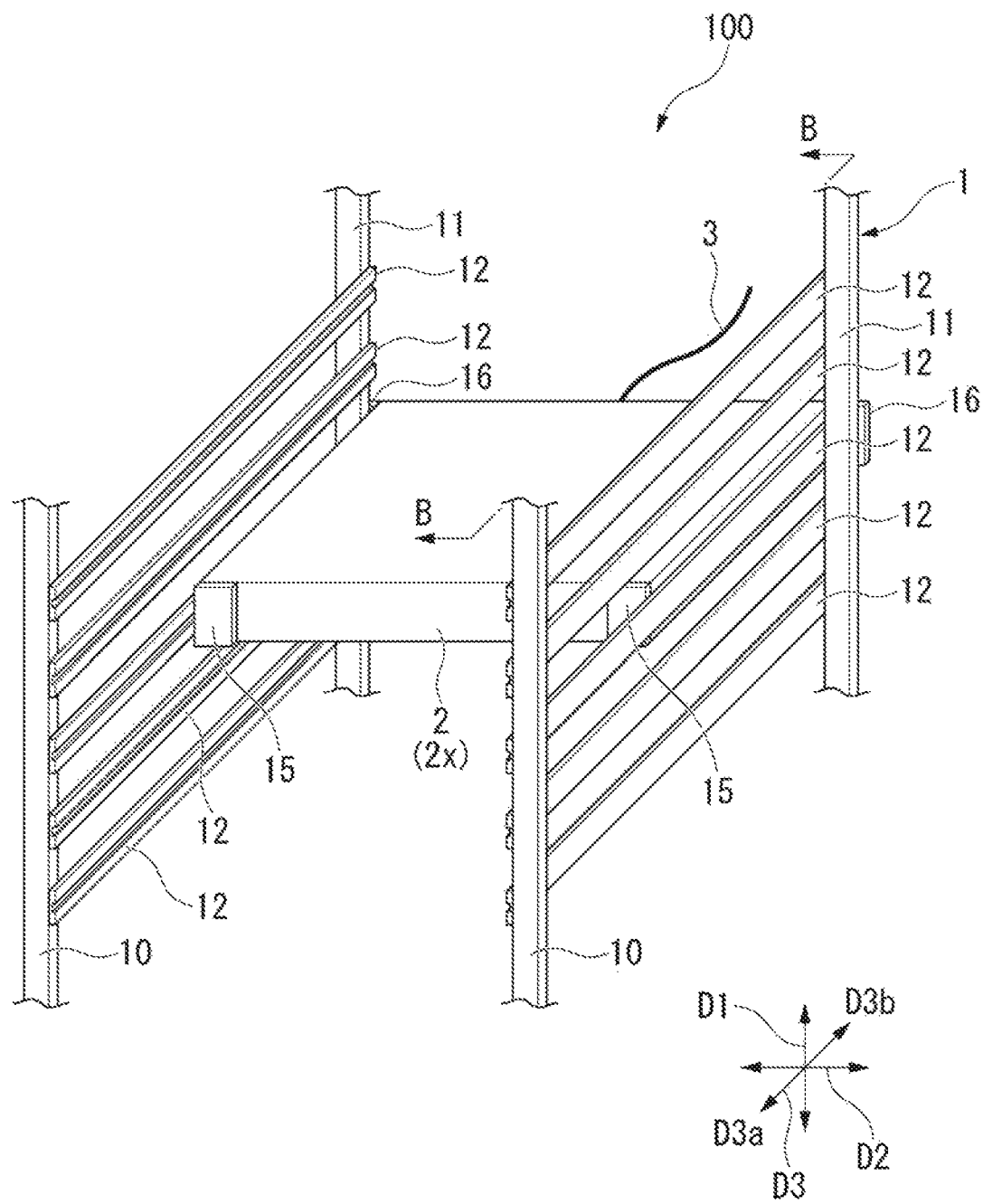
FIG. 3 is a perspective view of an embodiment of the minimum configuration of the rack-mounted type electronic device according to the present invention as viewed from the front side, showing a case in which the electronic device main body is disposed on the back side.

As shown in FIGS. 1 and 3, a pair of first columns 10 extending in the vertical direction D1 and provided with an interval therebetween in a width direction D2 intersecting the vertical direction D1 are provided.

As shown in FIGS. 1 and 3, a pair of second columns 11 are provided at positions away from the pair of first columns 10 on the side to the rear D3b in the depth direction D3 intersecting the vertical direction D1 and the width direction D2 and with an interval therebetween in the width direction D2.

As shown in FIGS. 1 and 3, a pair of rails 12 are provided at the same height in the vertical direction with an interval therebetween in the width direction D2. A plurality of rails 12 paired in the width direction connect the first column 10 and the second column 11 and are provided at intervals in the vertical direction D1. Each pair of rails 12 supports an engaging part 4 of the electronic device main body 2 such that it is slidable in the depth direction D3.

The first fixing piece 15 is provided on at least one end in the width direction D2 on the side in front D3a in the depth direction D3 of the electronic device main body 2. The first fixing piece 15 is movable between an abutment position at which the first fixing piece 15 can abut the first column 10 from the side in front D3a in the depth direction D3 and a non-abutment position of being disposed between first columns 10.

The second fixing piece 16 is provided on at least one end in the width direction D2 on the back side D3b in the electronic device main body 2. The second fixing piece 16 is movable between an abutment position at which the second fixing piece 16 can abut the second column 11 from the back side D3b in the depth direction D3 and a non-abutment position disposed between the second columns 11.

The rack-mounted type electronic device 100 of the present embodiment described above is equipped with a plurality of electronic device main bodies 2. Further, the rack-mounted type electronic device 100 has an electronic device main body 2x having a length in the depth direction D3 smaller than the other electronic device main bodies 2. Accordingly, the positions of the back faces serving as the end portions of the back side D3b in the plurality of electronic device main bodies 2 are different from each other.

That is, in a state in which the first fixing piece 15 is disposed at the abutment position as shown in FIG. 1 and abuts on the first column 10, the position of the back face of the electronic device main body 2x is disposed on the front side D3a as compared to the other electronic device main bodies 2, as shown in FIG. 2. In this state, the second fixing piece 16 is disposed at the non-abutment position by being disposed between the pair of second columns 11.

Thereafter, as shown in FIG. 3, the first fixing piece 15 is moved to the non-abutment position by disposing the first fixing piece 15 between the pair of first columns 10. Then, as shown in FIG. 4, the electronic device main body 2x can be pushed to the side to the rear D3b in the depth direction D3. In this state, the second fixing piece 16 is disposed at an abutment position at which the second fixing piece 16 can abut on the second column 11 from the back side D3b. As a result, the positions of the back faces of all the electronic device main bodies 2 can be aligned at the same position.

Therefore, the connection work of the wiring 3 on the back face of the electronic device main body 2 can be easily performed.

First Embodiment

Next, a first embodiment of the rack-mounted type electronic device 100A will be described with reference to FIGS. 5 to 7. In the first embodiment to be described below, the same portions as those in the above-described embodiments of the minimum configuration are denoted by the same reference numerals and repeated description will be omitted.

Figure 5:
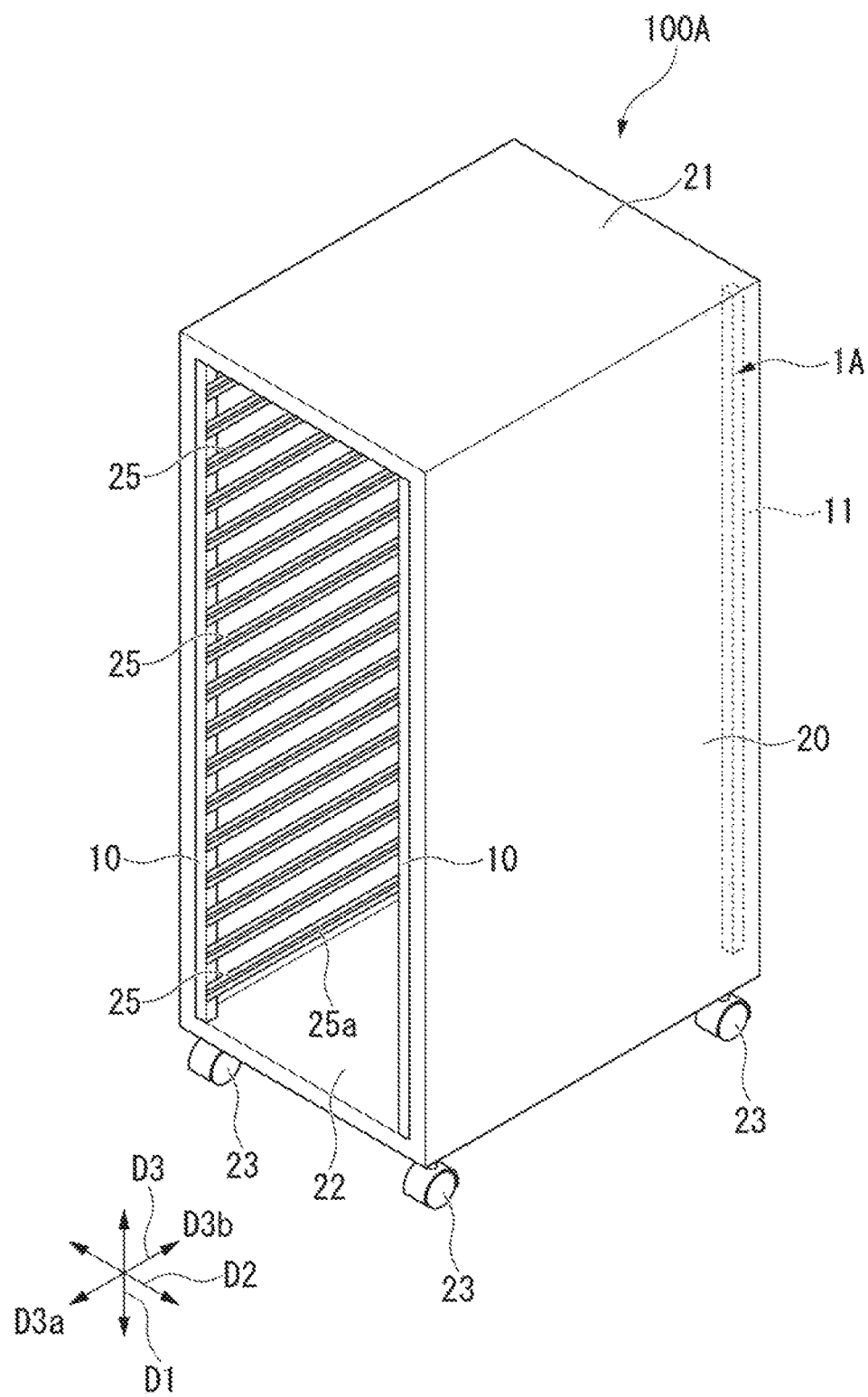
FIG. 5 is a perspective view of a rack of the rack-mounted type electronic device according to the first embodiment of the present invention as viewed from the front side.

As shown in FIG. 5, the electronic device storage rack 1A is equipped with a pair of side plates 20, a top plate 21, a bottom plate 22, and casters 23, in addition to the components of the electronic device storage rack 1 of the above-described embodiment of the minimum configuration.

The pair of side plates 20 is provided at intervals in the width direction D2. The pair of side plates 20 covers the first column 10, the second column 11, and the rail 12 from the outside in the width direction D2.

The top plate 21 covers the first column 10, the second column 11, and the rail 12 from above in the vertical direction D1. The top plate 21 connects the pair of side plates 20 in the width direction D2.

The bottom plate 22 covers the first column 10, the second column 11, and the rail 12 from below in the vertical direction D1. The bottom plate 22 connects the pair of side plates 20 to each other in the width direction D2.

The casters 23 are provided on the bottom plate 22. The casters 23 support the bottom plate 22 from below so that the bottom plate 22 can move in the width direction D2 and the depth direction D3. The casters 23 are provided at a plurality of locations. As an example, the casters 23 of the present embodiment are provided at a total of four locations at the end portions of the front side D3a and the back side D3b of the bottom plate 22 and at both end portions in the width direction D2.

The electronic device storage rack 1A has a box shape in which the front side D3a and the back side D3b in the depth direction D3 are open due to the aforementioned configuration.

Here, the electronic device main body 32 has a box shape having a rectangular parallelepiped shape. Engaging parts 33 are provided on both side faces 32a of the electronic device main body 32 facing the width direction D2. The engaging parts 33 have a fin shape that protrudes outward in the width direction D2 from each side face 32a and extends in the depth direction D3. The engaging parts 33 are provided at the center position in the vertical direction D1 on the side face 32a.

The rail 12 is provided with a groove 12a that is recessed from the surface facing the inside in the width direction D2 to the outside in the width direction D2. The groove 12a is formed over an entire region in the depth direction D3, and thus opens to the front side D3a and the back side D3b of the rail 12. By disposing the engaging part 33 of the electronic device main body 32 in the groove 12a, the engaging part 33 engages with the rail 12. Therefore, the rail 12 supports the engaging part 33 to be slidable in the depth direction D3.

Figure 6:
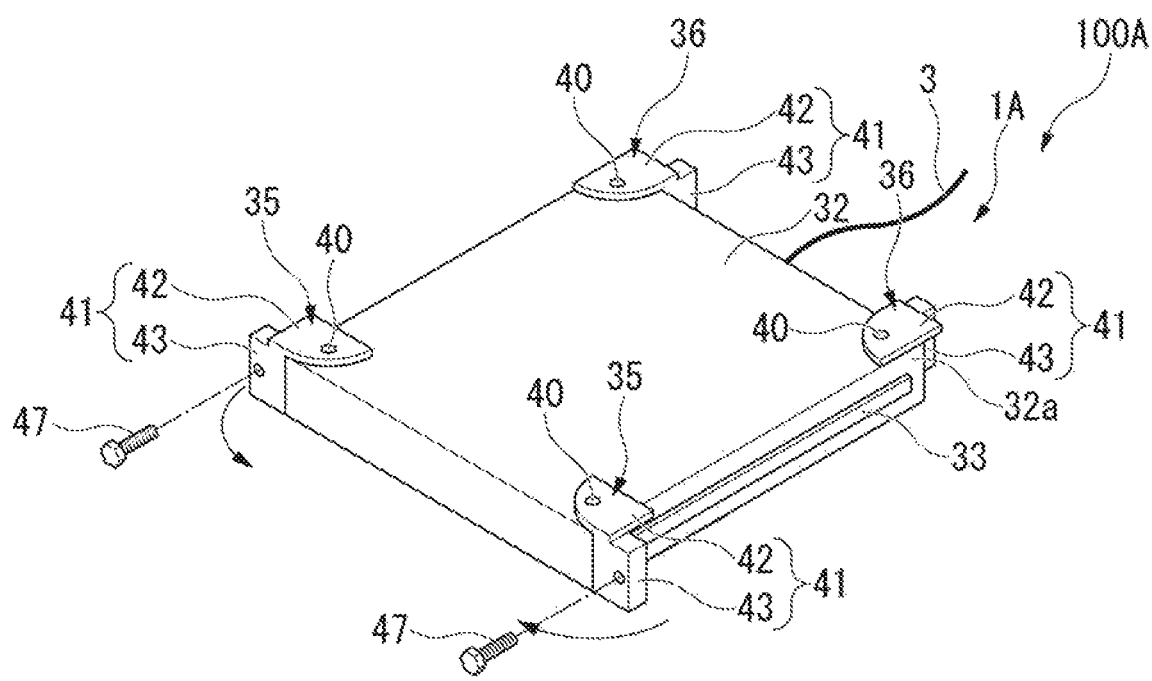
FIG. 6 is a perspective view of the electronic device main body of the rack-mounted type electronic device according to the first embodiment of the present invention as viewed from the front side, showing a case in which the electronic device main body is disposed on the front side.
Figure 7:
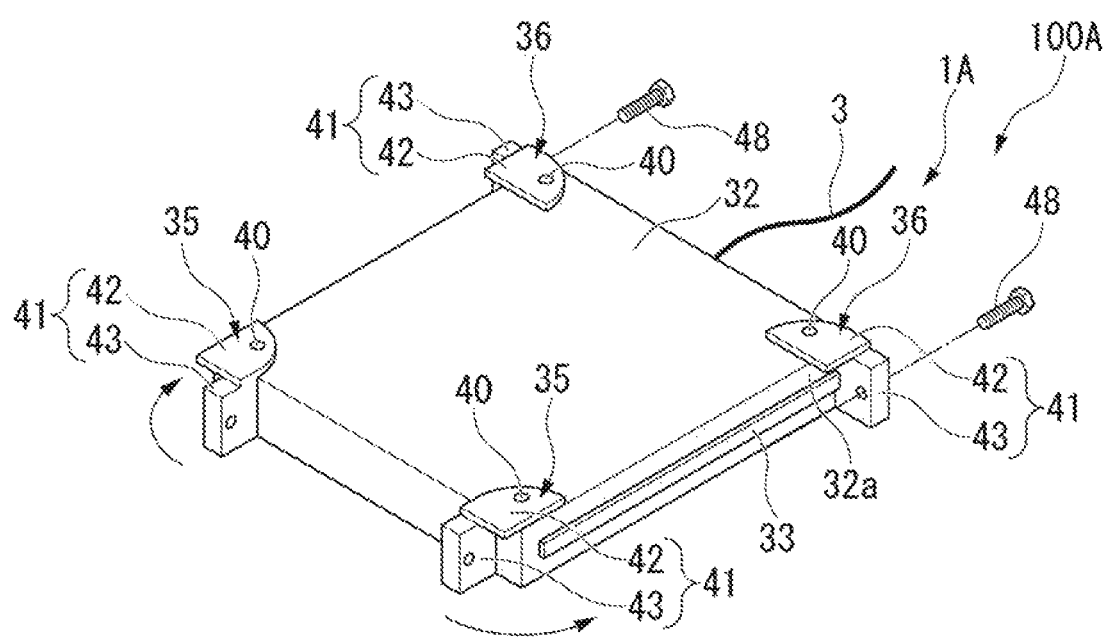
FIG. 7 is a perspective view of the electronic device main body of the rack-mounted type electronic device according to the first embodiment of the present invention as viewed from the front side, showing a case in which the electronic device main body is disposed on the back side.

As shown in FIG. 6, the first fixing pieces 35 are provided at the end portion of the electronic device main body 32 on the front side D3a in the depth direction D3 and at both ends in the width direction D2. Each first fixing piece 35 has a pin 40 and a fixing piece main body 41. The pin 40 penetrates the electronic device main body 32 in the vertical direction D1. The fixing piece main body 41 is relatively rotatable with respect to the electronic device main body 32 around the pin 40.

The pins 40 are provided at the corners of the electronic device main body 32.

The fixing piece main body 41 has a support plate part 42 and a protruding part 43. The support plate part 42 is disposed on the upper face of the electronic device main body 32 and the pins 40 penetrate the support plate part 42. The protruding part 43 is formed integrally with the support plate part 42 and can protrude from the electronic device main body 32 to the outside in the width direction D2 and the front side D3a. The protruding part 43 has a block shape. The dimension of the protruding part 43 in the vertical direction D1 is equivalent to the dimension of the electronic device main body 32 in the vertical direction D1.

As shown in FIG. 6, a state in which the protruding part 43 is disposed at the position protruding outward in the width direction D2 is a state in which the first fixing piece 35 is disposed at the abutment position. On the other hand, as shown in FIG. 7, a state in which the protruding part 43 protrudes toward the front side D3a is a state in which the first fixing piece 35 is disposed at the non-abutment position. A first fixing member 47 such as a bolt is provided in the protruding part 43. At the abutment position, the protruding part 43 can be fixed to the first column 10 from the front side D3a by the first fixing member 47.

The second fixing pieces 36 are provided at the end portion on the back side D3b of the electronic device main body 32 and at both ends in the width direction D2. Each second fixing piece 36 has a pin 40 that penetrates the electronic device main body 32 in the vertical direction D1 like the first fixing piece 35, and a fixing piece main body 41 which is relatively rotatable with respect to the electronic device main body 32 around the pin 40.

As in the case of the first fixing piece 35, as shown in FIG. 6, a state in which the protruding part 43 protrudes to the back side D3b is a state in which the second fixing piece 36 is disposed at the non-abutment position. Further, as shown in FIG. 7, a state in which the protruding part 43 of the fixing piece main body 41 is disposed at a position protruding outward in the width direction D2 is a state in which the second fixing piece 36 is disposed at the abutment position. A second fixing member 48 such as a bolt is provided in the protruding part 43. At the abutment position, the protruding part 43 can be fixed to the second column 11 from the back side D3b by the second fixing member 48.

In the rack-mounted type electronic device 100A of the present embodiment described above, the first fixing piece 35 is provided at the end portion on the front side D3a of the electronic device main body 32, and the second fixing piece 36 is provided at the end portion on the back side D3b. The protruding parts 43 of the first fixing piece 35 and the second fixing piece 36 are provided to be rotatable with respect to the electronic device main body 32 around the pin 40.

Accordingly, among the plurality of electronic device main bodies 32, the electronic device main body 32x having a length in the depth direction D3 smaller than the other electronic device main bodies 32 rotates the protruding part 43 of the first fixing piece 35 from the abutment position to dispose it at the non-abutment position and also disposes the protruding part 43 of the second fixing piece 36 at the non-abutment position. Thus, the electronic device main body 32x can be pushed into the back side D3b.

Thereafter, the second fixing piece 36 is disposed at the abutment position, and the protruding part 43 of the second fixing piece 36 is caused to abut on the second column 11 from the back side D3b. In this state, the protruding part 43 is fixed to the second column 11 by the second fixing member 48. As a result, the positions of the back faces of all the electronic device main bodies 32 can be aligned at the same position to maintain the same state.

Further, for example, there is a case in which the electronic device main body 32x may be disposed between the electronic device main bodies 32x having a length in the depth direction D3 larger than that of the electronic device main body 32x by being sandwiched between the top and bottom in the vertical direction D1 (see FIG. 2). Even in this case, by aligning the positions of the back faces of all the electronic device main bodies 32 at the same position, the operator can insert a hand into the back face of all the electronic device main bodies 32 from above or below to perform the connection work of the wiring 3.

Therefore, it is possible to facilitate the connection work of the wiring 3 on the back face of the electronic device main body 32.

Here, in the present embodiment, the first fixing member 47 and the second fixing member 48 are not necessarily required.

Second Embodiment

Figure 8:
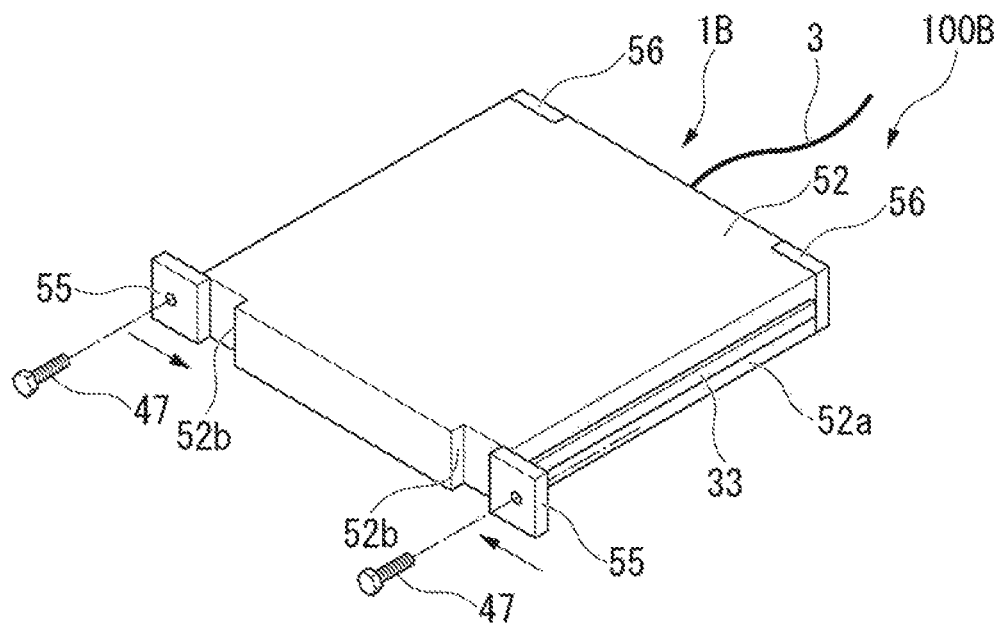
FIG. 8 is a perspective view of an electronic device main body of a rack-mounted type electronic device according to a second embodiment of the present invention as viewed from the front side, showing a case in which the electronic device main body is disposed on the front side.
Figure 9:
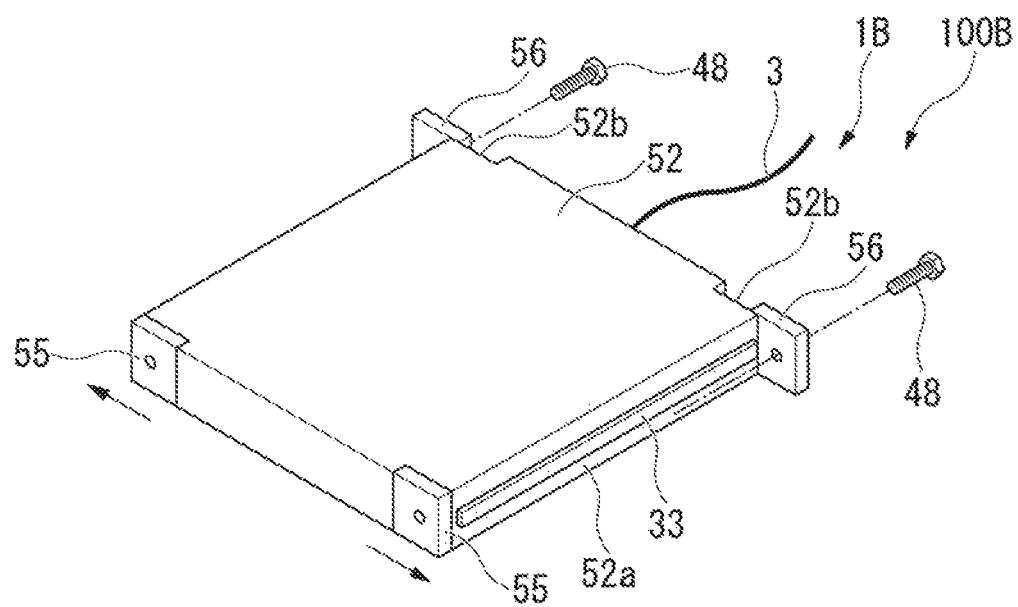
FIG. 9 is a perspective view of the electronic device main body of the rack-mounted type electronic device according to the second embodiment of the present invention as viewed from the front side, showing a case in which the electronic device main body is disposed on the back side.

Next, a second embodiment of a rack-mounted type electronic device 100B will be described with reference to FIGS. 8 and 9. In the second embodiment to be described below, the same parts as those in the above embodiment will be described by being denoted by the same reference numerals, and repeated description will be omitted.

In the second embodiment, the first fixing piece 55 and the second fixing piece 56 in the electronic device storage rack 1B are different from those in the first embodiment.

The first fixing pieces 55 are provided at the end portion of the electronic device main body 52 on the front side D3a in the depth direction D3 and at both ends in the width direction D2. Each first fixing piece 55 has a plate shape that can protrude from the side face 52a of the electronic device main body 52 to the outside in the width direction D2. The first fixing piece 55 can be accommodated in a recessed part 52b that is recessed in the width direction D2 and the depth direction D3, from the corners of both end portions of the electronic device main body 52 on the front side D3a. For example, a rail (not shown) or the like is provided in the recessed part 52b. The first fixing piece 55 is supported by the rail in a slide-movable manner. The recessed part 52b is formed to have a size equivalent to an external dimension of the first fixing piece 55 so that the first fixing piece 55 can be accommodated.

The first fixing piece 55 advances and retreats in the width direction D2 with respect to the electronic device main body 52. As shown in FIG. 8, a position at which the first fixing piece 55 protrudes outward in the width direction D2 from the recessed part 52b is the abutment position. Further, as shown in FIG. 9, a position at which the first fixing piece 55 is accommodated in the recessed part 52b is the non-abutment position.

At the abutment position, the first fixing piece 55 can be fixed to the first column 10 from the front side D3a by the first fixing member 47.

The second fixing piece 56 has the same configuration as the first fixing piece 55. That is, the second fixing piece 56 has a plate shape. As shown in FIG. 8, the position at which the second fixing piece 56 is accommodated in the recessed part 52b of the electronic device main body 52 is the non-abutment position. Further, as shown in FIG. 9, the position at which the second fixing piece 56 protrudes from the recessed part 52b to the outside in the width direction D2 is the abutment position.

At the abutment position, the second fixing piece 56 can be fixed to the second column 11 from the back side D3b by the second fixing member 48.

In the rack-mounted type electronic device 100B of the present embodiment described above, the first fixing piece 55 is provided at the end portion on the front side D3a of the electronic device main body 52. Further, the second fixing piece 56 is provided at the end portion on the back side D3b of the electronic device main body 52. The first fixing piece 55 and the second fixing piece 56 are provided to be slidable with respect to the electronic device main body 52 in the width direction D2. Therefore, when the electronic device main body 52x having a small length in the depth direction D3 among the plurality of electronic device main bodies 52 is provided, by causing the first fixing piece 55 to slide from the abutment position to be disposed at the non-abutment position, and by also disposing the second fixing piece 56 at the non-abutment position, the electronic device main body 52 can be pushed into the back side D3b.

Thereafter, the second fixing piece 56 is moved to slide and disposed at the abutment position, the second fixing piece 56 is caused to abut on the second column 11 from the back side D3b, and the second fixing piece 56 is fixed to the second column 11 by the second fixing member 48. As a result, the positions of the back faces of all the electronic device main bodies 52 can be aligned at the same position to maintain the same state.

Therefore, it is possible to facilitate the connection work of the wiring 3 on the back face of the electronic device main body 52.

Also in this embodiment, the first fixing member 47 and the second fixing member 48 are not necessarily required.

Third Embodiment

Next, a third embodiment of the rack-mounted type electronic device 100C will be described with reference to FIGS. 10 and 11. In the third embodiment to be described below, the same parts as those in the aforementioned embodiments will be described by being denoted by the same reference numerals, and repeated description will be omitted.

In the third embodiment, the first fixing piece 65 and the second fixing piece 66 in the electronic device storage rack 1C are different from the above-described embodiments.

The first fixing pieces 65 are provided at the end portion on the front side D3a in the depth direction D3 of the electronic device main body 62 and at both ends in the width direction D2. Each of the first fixing pieces 65 has a pin 67 which is provided at a corner of the electronic device main body 62 and extends in the vertical direction D1, and a fixing piece main body 68 that can relatively rotate with respect to the electronic device main body 62 around the pin 67. The fixing piece main body 68 has a plate shape. With the aforementioned configuration, the first fixing piece 65 has a hinge structure.

Figure 10:
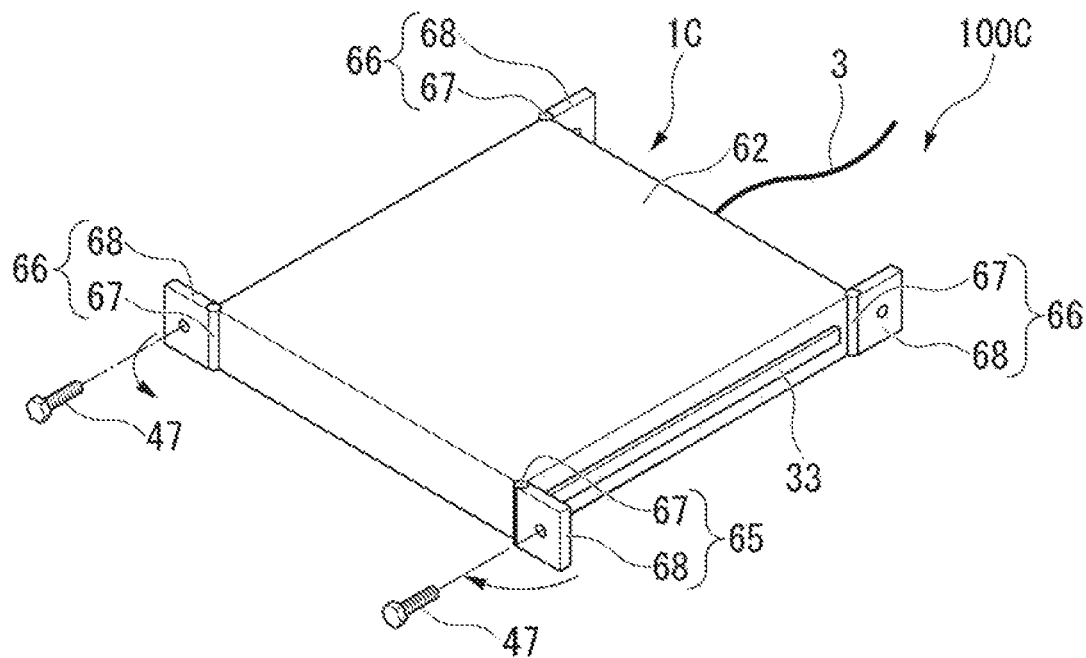
FIG. 10 is a perspective view of an electronic device main body of a rack-mounted type electronic device according to a third embodiment of the present invention as viewed from the front side, showing a case where the electronic device main body is disposed on the front side.
Figure 11:
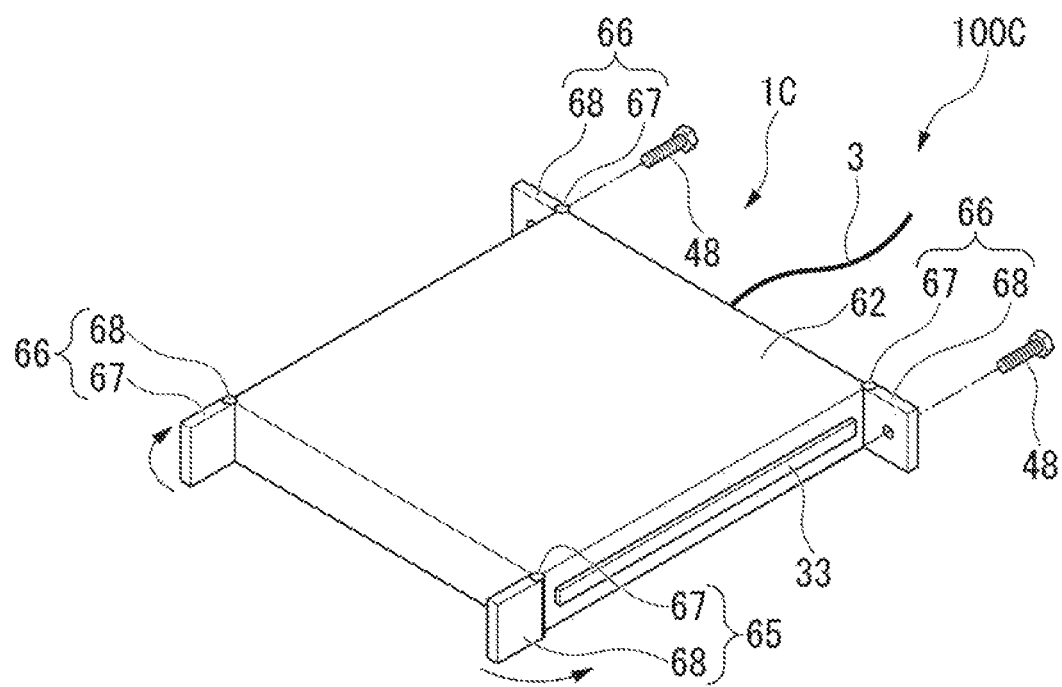
FIG. 11 is a perspective view of the electronic device main body of the rack-mounted type electronic device according to the third embodiment of the present invention as viewed from the front side, showing a case in which the electronic device main body is disposed on the back side.

As shown in FIG. 10, the state in which the fixing piece main body 68 is disposed at a position protruding outward in the width direction D2 is a state in which the first fixing piece 65 is disposed at the abutment position. On the other hand, as shown in FIG. 11, a state in which the fixing piece main body 68 protrudes toward the front side D3a is a state in which the first fixing piece 65 is disposed at the non-abutment position. A first fixing member 47 such as a bolt is provided in the fixing piece main body 68. At the abutment position, the fixing piece main body 68 can be fixed to the first column 10 from the front side D3a by the first fixing member 47.

The second fixing pieces 66 are provided at the end portion on the back side D3b in the depth direction D3 of the electronic device main body 62 and at both ends in the width direction D2. Each of the second fixing pieces 66 includes a pin 67 extending in the vertical direction D1 like the first fixing piece 65, and a fixing piece main body 68 that can relatively rotate with respect to the electronic device main body 62 around the pin 67. That is, the second fixing piece 66 has a hinge structure like the first fixing piece 65.

As shown in FIG. 10, a state in which the fixing piece main body 68 protrudes to the back side D3b is a state in which the second fixing piece 66 is disposed at the non-abutment position. On the other hand, as shown in FIG. 11, a state in which the fixing piece main body 68 is disposed at a position protruding outward in the width direction D2 is a state in which the second fixing piece 66 is disposed at the abutment position. A second fixing member 48 such as a bolt is provided at the fixing piece main body 68.

At the abutment position, the fixing piece main body 68 can be fixed to the second column 11 from the back side D3b by the second fixing member 48.

In the rack-mounted type electronic device 100C of the third embodiment described above, the first fixing piece 65 is provided at the end portion on the front side D3a of the electronic device main body 62. Further, a second fixing piece 66 is provided at the end portion on the back side D3b of the electronic device main body 62. Further, the fixing piece main bodies 68 of the first fixing piece 65 and the second fixing piece 66 are provided to be relatively rotatable with respect to the electronic device main body 62 in the width direction D2.

Therefore, when the electronic device main body 62x having a length in the depth direction D3 smaller than the other electronic device main bodies 62 is provided, by rotating the fixing piece main body 68 of the first fixing piece 65 to be disposed at the non-abutment position, and by also disposing the second fixing piece 66 at the non-abutment position, the electronic device main body 62 can be pushed into the back side D3b.

Thereafter, the fixing piece main body 68 of the second fixing piece 66 is rotated and disposed at the abutment position, the fixing piece main body 68 of the second fixing piece 66 is caused to abut on the second column 11 from the back side D3b, and the fixing piece main body 68 is fixed to the second column 11 by the second fixing member 48. As a result, the positions of the back faces of all the electronic device main bodies 62 can be aligned at the same position to maintain the same state.

Therefore, it is possible to facilitate the connection work of the wiring 3 on the back face of the electronic device main body 62.

Also in this embodiment, the first fixing member 47 and the second fixing member 48 are not necessarily required.

Although embodiments of this invention have been described above, these embodiments are shown as an example and are not intended to limit the scope of invention. These embodiments can be implemented in various other forms, and various omissions, replacements, and changes can be made without departing from the scope of the invention. These embodiments and modifications thereof are included in the invention described in the claims and equivalents thereof, as well as they are included in the scope and gist of the invention.

For example, the first fixing pieces 35, 55 and 65 may be fixable to the first column 10 by a fixing member such as a bolt not only at the abutment position but also at the non-abutment position. Similarly, the second fixing pieces 36, 56 and 66 may be fixable to the second column 11 by a fixing member such as a bolt not only at the abutment position but also at the non-abutment position.

Further, the first fixing pieces 15, 35, 55 and 65 and the second fixing pieces 16, 36, 56 and 66 are not limited to the aforementioned case. For example, a structure in which the first fixing pieces 15, 35, 55 and 65 and the second fixing pieces 16, 36, 56 and 66 are moved between the abutment position and the non-abutment position by detaching the first and second fixing pieces from the electronic device main body 2, 32, 52 and 62 may be provided.

Further, the first fixing pieces 15, 35, 55 and 65 and the second fixing pieces 16, 36, 56 and 66 may not necessarily be provided at both ends in the width direction D2 of the electronic device main body 2, 32, 52 and 62, and may be provided only at one end in the width direction D2 of the electronic device main body 2.

Further, the first fixing pieces 15, 35, 55 and 65 and the second fixing pieces 16, 36, 56 and 66 may be provided only in the electronic device main bodies 2x, 32x, 52x and 62x having a small length in the depth direction D3.

What is claimed is:

1. An electronic device storage rack comprising:
a pair of first columns which extends in a vertical direction and is provided at intervals in a width direction intersecting the vertical direction;
a pair of second columns which is provided at a position away from the pair of first columns on a back side in a depth direction intersecting the vertical direction and the width direction and at intervals in the width direction;
a plurality of pairs of rails which is disposed in pairs at intervals in the width direction to connect the first column and the second column, is provided at intervals in the vertical direction, and supports an engaging part in an electronic device main body provided with wiring extending from the back side for each pair to be slidable in the depth direction;
a first fixing piece which is provided on at least one end in the width direction on a front side in the depth direction of the electronic device main body, and is movable between an abutment position capable of abutting on the first column from the front side and a non-abutment position disposed between the first columns; and
a second fixing piece which is provided on at least at one end in the width direction on the back side of the electronic device main body, and is movable between the abutment position capable of abutting on the second column from the back side and the non-abutment position disposed between the second columns.

2. The electronic device storage rack according to claim 1, further comprising:
a pair of side plates which covers the first column, the second column, and the rail from an outside in the width direction;
a top plate and a bottom plate which cover the first column, the second column, and the rail from the vertical direction and connect the pair of side plates; and
casters provided on the bottom plate to movably support the bottom plate from below.

3. The electronic device storage rack according to claim 1, wherein the first fixing piece and the second fixing piece are provided in the electronic device main body to be rotatable about an axis extending in the vertical direction, and thus is movable between the abutment position and the non-abutment position.

4. The electronic device storage rack according to claim 1, wherein the first fixing piece and the second fixing piece are provided in the electronic device main body to be slidable in the width direction, and thus is movable between the abutment position and the non-abutment position.

5. The electronic device storage rack according to claim 1, further comprising:
a first fixing member capable of fixing the first fixing piece to the first column at the abutment position; and
a second fixing member capable of fixing the second fixing piece to the second column at the abutment position.

6. A rack-mounted type electronic device comprising:
the electronic device storage rack comprising a pair of first columns which extends in a vertical direction and is provided at intervals in a width direction intersecting the vertical direction, a pair of second columns which is provided at a position away from the pair of first columns on a back side in a depth direction intersecting the vertical direction and the width direction and at intervals in the width direction, a plurality of pairs of rails which is disposed in pairs at intervals in the width direction to connect the first column and the second column, is provided at intervals in the vertical direction, and supports an engaging part in an electronic device main body provided with wiring extending from the back side for each pair to be slidable in the depth direction, a first fixing piece which is provided on at least one end in the width direction on a front side in the depth direction of the electronic device main body, and is movable between an abutment position capable of abutting on the first column from the front side and a non-abutment position disposed between the first columns, and a second fixing piece which is provided on at least at one end in the width direction on the back side of the electronic device main body, and is movable between the abutment position capable of abutting on the second column from the back side and the non-abutment position disposed between the second columns; and a plurality of electronic device main bodies accommodated in the electronic device storage rack to overlap in the vertical direction, wherein at least two types of electronic device main bodies having dimensions in the depth direction different from each other are included as the plurality of electronic device main bodies.

* * * * *